(12) United States Patent
Mastoris et al.

(10) Patent No.: US 6,971,892 B2
(45) Date of Patent: Dec. 6, 2005

(54) METHOD AND DEVICE FOR PROTECTING PINS OF A PIN CONNECTOR

(75) Inventors: Steven F. Mastoris, El Dorado Hills, CA (US); Akbar Monfared, Placerville, CA (US); Ian R. Inglis, Rocklin, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 48 days.

(21) Appl. No.: 10/172,045

(22) Filed: Jun. 13, 2002

(65) Prior Publication Data

US 2003/0232528 A1    Dec. 18, 2003

(51) Int. Cl.[7] ............................................. H01R 13/44
(52) U.S. Cl. ................................................... 439/149
(58) Field of Search ................................ 439/149, 352, 439/358, 345, 350, 357, 180, 108, 610, 579, 439/680–681, 135, 801, 414, 750, 940

(56) References Cited

U.S. PATENT DOCUMENTS

| | | | | |
|---|---|---|---|---|
| 5,242,311 A | * | 9/1993 | Seong | 439/135 |
| 5,380,216 A | * | 1/1995 | Broeksteeg et al. | 439/352 |
| 5,571,022 A | * | 11/1996 | Schaarschmidt | 439/135 |
| 2003/0064611 A1 | * | 4/2003 | Musolf et al. | 439/43 |

* cited by examiner

Primary Examiner—J. F. Duverne

(57) ABSTRACT

A method of protecting the pins of a pin connector of a backplane preferably includes installing a protective cover over the pins of the pin connector. The protective cover preferably includes at least one connector having receptacles for receiving the pins of the pin connector of the backplane and a handle extending from the at least one connector.

28 Claims, 5 Drawing Sheets

METHOD AND DEVICE FOR PROTECTING PINS OF A PIN CONNECTOR

FIELD OF THE INVENTION

The present invention relates to the field of connectors. More specifically, the present invention relates the field of protecting the pins of a pin connector, particularly a pin connector on a backplane of, for example, a blade server.

BACKGROUND OF THE INVENTION

Computers and their peripheral devices are used for a wide variety of purposes including, data storage, communication, and document creation. Peripheral Component Interconnect (PCI) is a local bus that is commonly used to connect a computer with one or more peripheral devices. A PCI bus provides a high-speed connection with peripherals and can connect multiple peripheral devices to the host computer. The PCI bus typically plugs into a PCI slot on the motherboard of the host computer.

CompactPCI or "cPCI" was introduced in 1995 based on the PCI standard and has since become one of the fastest-growing industrial bus architectures to date. Initially targeted at the telecommunications and industrial control markets, CompactPCI takes the popular PCI interface and packages it into a smaller, more rugged unit. The most noticeable change made to the architecture was the adoption of a form factor in which all dimensions and mechanical components are standardized by the Institute of Electrical and Electronics Engineers (IEEE). Consequently, numerous vendors can supply mechanically interchangeable components.

One particularly important use of the CompactPCI is in a blade server, also called an ultradense server. Blade servers are comprehensive computing systems that include processor, memory, network connections, and associated electronics, all mounted on a single motherboard called a blade. There are many types of blades—server blades, storage blades, network blades and more.

The server blade, along with storage, networking and other blades, are typically installed in a rack-mountable enclosure that houses multiple blades that share common resources such as cabling, power supplies, and cooling fans. The blades are connected into a common circuit board, called a backplane, that provides connections to and between blades for both data and power. With its modular, hot-pluggable architecture, the easily accessible blade server offers increased computing density while ensuring both maximum scalability and ease of management.

Typically, the backplane provides rows of pins, configured according to the cPCI standard, for connection to the various blades that might be installed in the blade server. The blades each have a corresponding cPCI connector that includes receptacles or holes in which the pins of the cPCI connector on the backplane are received when the blade is installed. Because of the complex and tightly packed circuitry that may exist on a blade, a large number of connections are required between the blade and the backplane. Consequently, there are a relatively large number of delicate pins provided in each connection row on the backplane that might receive a blade.

The pins are packed close together according to the cPCI standard to provide the necessary number of connections within an appropriate amount of real estate on the backplane. In part, because the pins are so closely packed together, the pins are relatively thin and, therefore, somewhat delicate. A pin can easily be bent or broken.

Damage to the pins can occur when a blade is improperly installed. Damage to the pins can also occur during the storage or shipping of the backplane.

If a pin is broken or bent and fails to make a connection with an installed blade, the blade will likely not function properly, and it may be very difficult to identify the problem as a bent or missing pin among so many pins on the backplane. Consequently, it becomes important to take any precautions possible to protect the pins of the backplane and prevent any damage being done to any pin, whether during manufacturing, shipping or while the backplane is in service.

SUMMARY OF THE INVENTION

In one of many possible embodiments, the present invention provides a method of protecting pins of a pin connector of a backplane. The method includes installing a protective cover over the pins of the pin connector. The protective cover includes at least one connector having receptacles for receiving the pins of the pin connector of the backplane and a handle extending from the connector.

In another embodiment, the present invention provides a method of making a protective cover for pins of a pin connector of a backplane. This method includes obtaining a number of connectors having receptacles for receiving the pins; sizing the connectors to a common thickness; and attaching the connectors to a handle.

In another embodiment, the present invention provides a protective cover for a pin connector of a backplane, the cover including at least one connector having receptacles for receiving pins of a pin connector of a backplane; and a handle extending from the at least one connector for installing or removing the protective cover.

Additional advantages and novel features of the invention will be set forth in the description which follows or may be learned by those skilled in the art through reading these materials or practicing the invention. The advantages of the invention may be achieved through the means recited in the attached claims.

BRIEF DESCRIPTION OF THE DRAWINGS

The accompanying drawings illustrate preferred embodiments of the present invention and are a part of the specification. Together with the following description, the drawings demonstrate and explain the principles of the present invention. The illustrated embodiments are examples of the present invention and do not limit the scope of the invention.

Throughout the drawings, identical reference numbers designate similar, but not necessarily identical, elements.

DETAILED DESCRIPTION OF THE PREFERRED EMBODIMENTS

Figure 1:
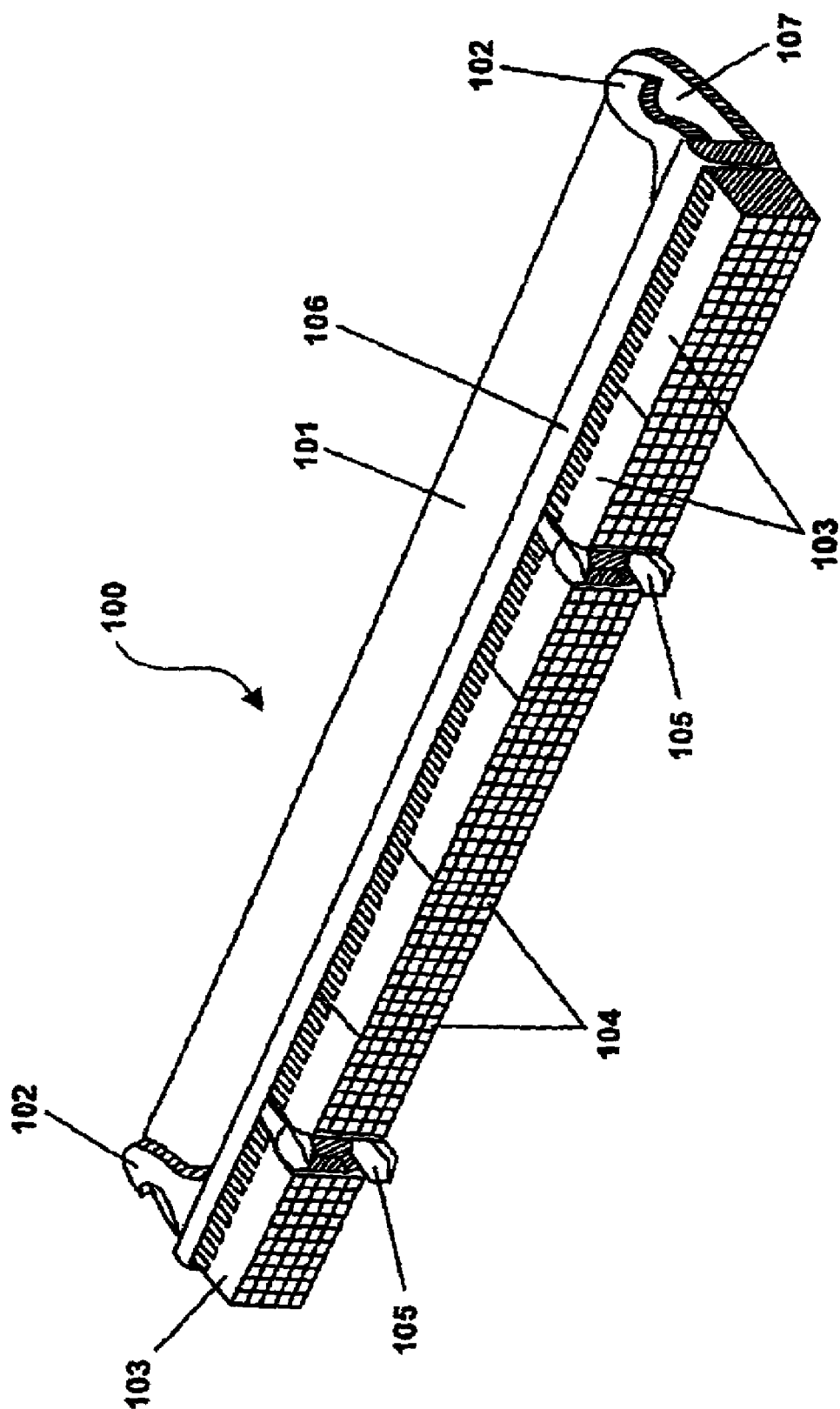
FIG. 1 is an illustration of a protective cover for the pins of a backplane according to an embodiment of the present invention.

FIG. 1 is an illustration of a protective cover (100) for the pins of a backplane according to an embodiment of the present invention. As shown in FIG. 1, the protective cover (100) preferably includes connector blocks (103) that are arranged in a row corresponding to a row of pins on a backplane for receiving a blade. Alternatively, the connector (103) of the protective cover (100) may be a single unit from a solid material of similar form factor. These connectors (103) include holes or receptacles (104) in which the pins of the backplane are received. Preferably, these receptacles (104) are arranged according to the cPCI standard.

The connectors (103) are secured to a plate (106) so that they can be installed or removed as a unit. A handle (101) may be connected to, or integrally formed with, the plate (106) to facilitate handling of the protective cover (100).

A pair of hooks (102) are also attached to, or integrally formed with, the plate (106). One hook (102) is disposed at each end of the plate (106). The use of these hooks (102) will be explained below.

Preferably, the handle (101) and the hooks (102) are arranged along opposite edges of the plate (106). This leaves a gap (107) between the handle (101) and the hooks (102). The purpose of this gap (107) will be explained below.

Guides (105) maybe disposed in between the connectors (103) at various points on the protective cover (100). On the connector of a blade, these or similar guides would be used to hold a key that is specific to the type of blade on which the keys are installed. These blade keys are matched by corresponding keys in between the connection pins on a connector of the backplane.

This key arrangement insures that only a particular type of blade can be connected to a connector on the backplane for receiving that type of blade. Thus, if a connector on a backplane is arranged to receive only a single type of blade, the keys in that backplane connector will prevent any other type of blade from being installed in that connector.

Keys may or may not be loaded into the guides (105) of the protective cover (100). The use of keys in the cover (100) is not necessary for the cover (100) to protect the pins of a backplane connector.

The protective cover (100) can be constructed by taking standard connectors (103), preferably compliant with the cPCI standard, and sizing those connectors (103) down for attachment to the plate (106). Alternatively, the protective cover (100) can be constructed from any integration of the various components described above.

Figure 2:
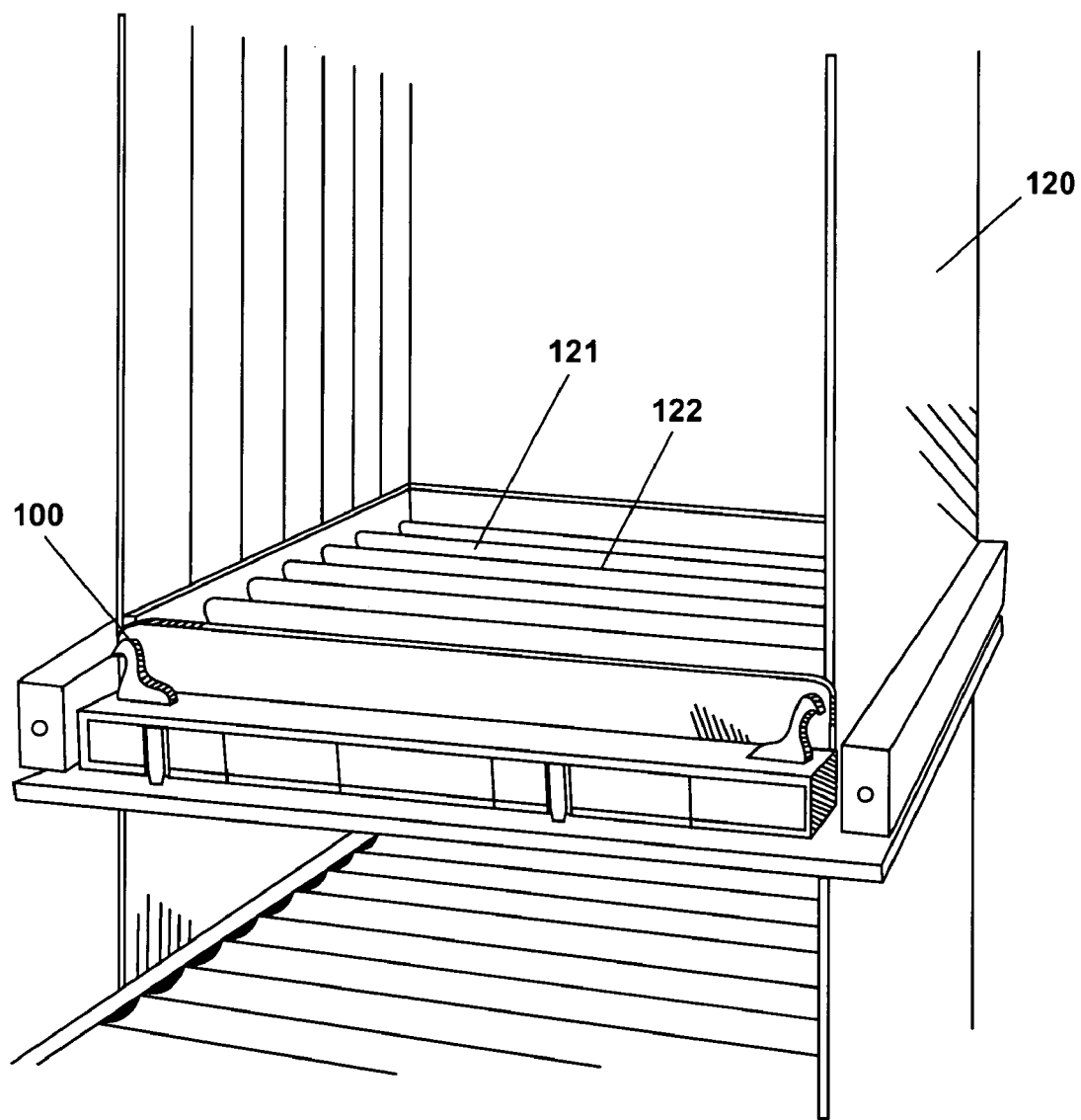
FIG. 2 is an illustration of the protective cover of FIG. 1 installed on a backplane.

FIG. 2 is an illustration of the protective cover of FIG. 1 installed on a backplane. As shown in FIG. 2, a backplane (121) is installed in the rack (120) of a blade server. Various blades can then be installed within the rack (120) by connection with the backplane (121) to complete the blade server.

At any point in time, there may well be connectors on the backplane, comprised of connections pins (122), that are not in use, i.e., have no blade attached thereto. This may be true when the backplane (121) is in manufacture, storage or shipping, or after being placed in service. In any case, a protective cover (100) can be installed on any such unoccupied connector of the backplane (121). The pins of that connector on the backplane (121) are received in the receptacles (104; FIG. 1) of the protective cover (100) and are, thereby, protected from being bent, broken or otherwise damaged. FIG. 2 illustrates the protective cover (100) installed on a pin connector of a backplane (121).

If the protective cover (100) is used to protect pin connectors on the backplane (121) when the backplane (121) is in service in a blade server, there will likely be some pin connectors on the backplane (121) hosting blades and other pin connectors that are unoccupied on the backplane. These unoccupied pin connectors may be covered and protected by a protective cover (100).

It may be desirable, in these circumstances, to separate or divide the blades installed in the blade server. It may be desirable to separate the blades merely according to the types of blades installed in the blade server. It may be desirable to separate blades that are working together in a particular or logical arrangement. It may also be desirable to separate the blades to contain and prevent the spread of an electrical fire or other problems that may arise in one of the blades.

Figure 3:
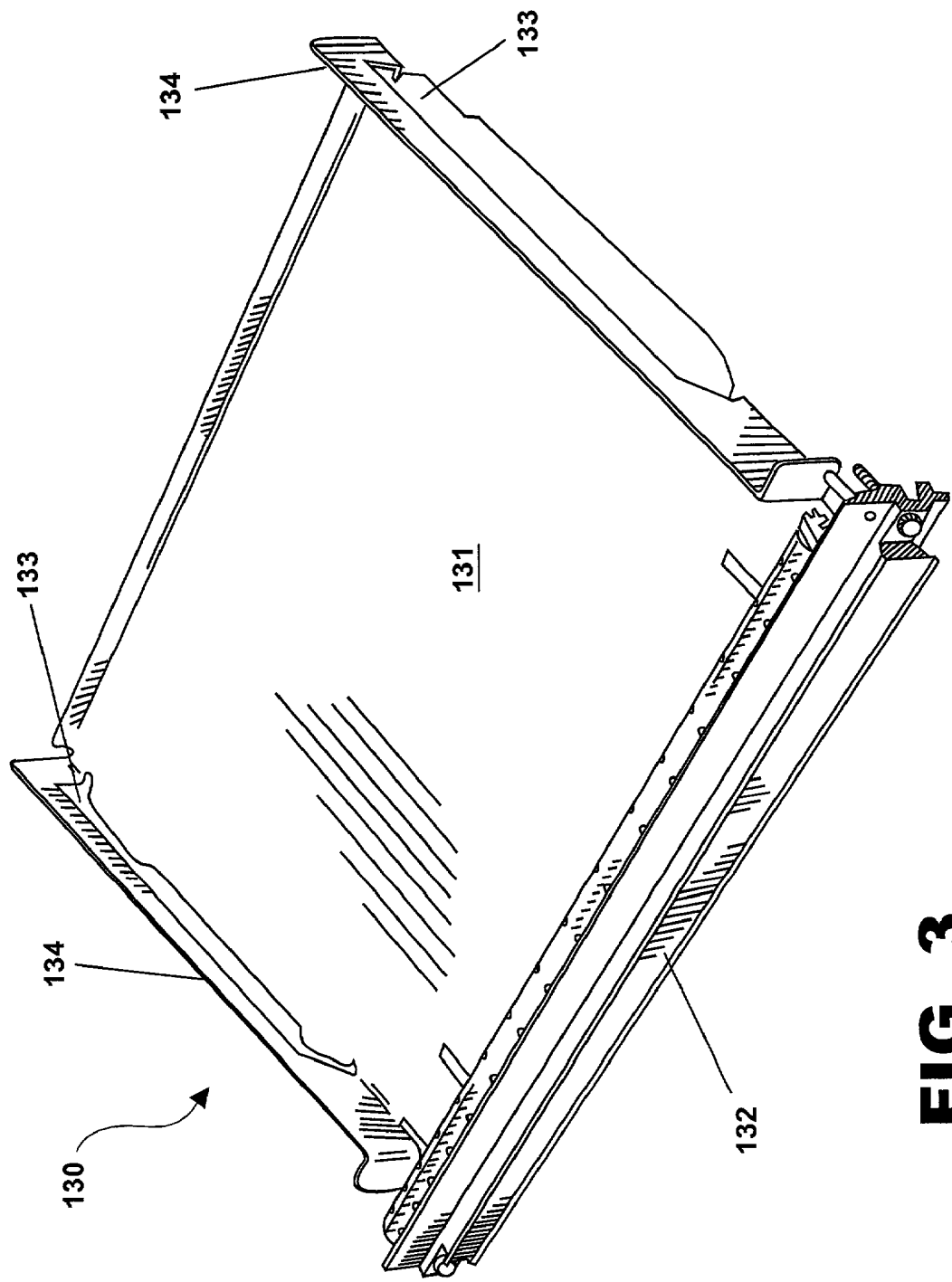
FIG. 3 is an illustration of a divider according to an embodiment of the present invention for use with the protective cover of FIG. 1.

FIG. 3 is an illustration of a divider according to an embodiment of the present invention for use with the protective cover of FIG. 1. This divider (130) can be installed in any open slot for a blade in a blade server to divide the blades on either side of that slot.

The divider (130) preferably includes a planar sheet (131) that can be formed, for example, of sheet metal for dividing portions of a blade sever rack or separate blades or groups of blades in a blade server. A handle (132) is preferably provided on the divider (130) to facilitate handling, installation and removal of the divider (130).

Side walls (134) preferably extend perpendicularly from the planar sheet (131). These side walls (134) give the divider (130) something like the approximate thickness of blade.

Slots (133) are preferably formed between the planar sheet (131) and each of the two side walls (134). The slots (133) are preferably formed along the base of each side wall (134) where the side wall (134) extends from the planar sheet (131). These slots (133) allow the divider (130) to be used with the protective cover (100) described above.

Figure 4:
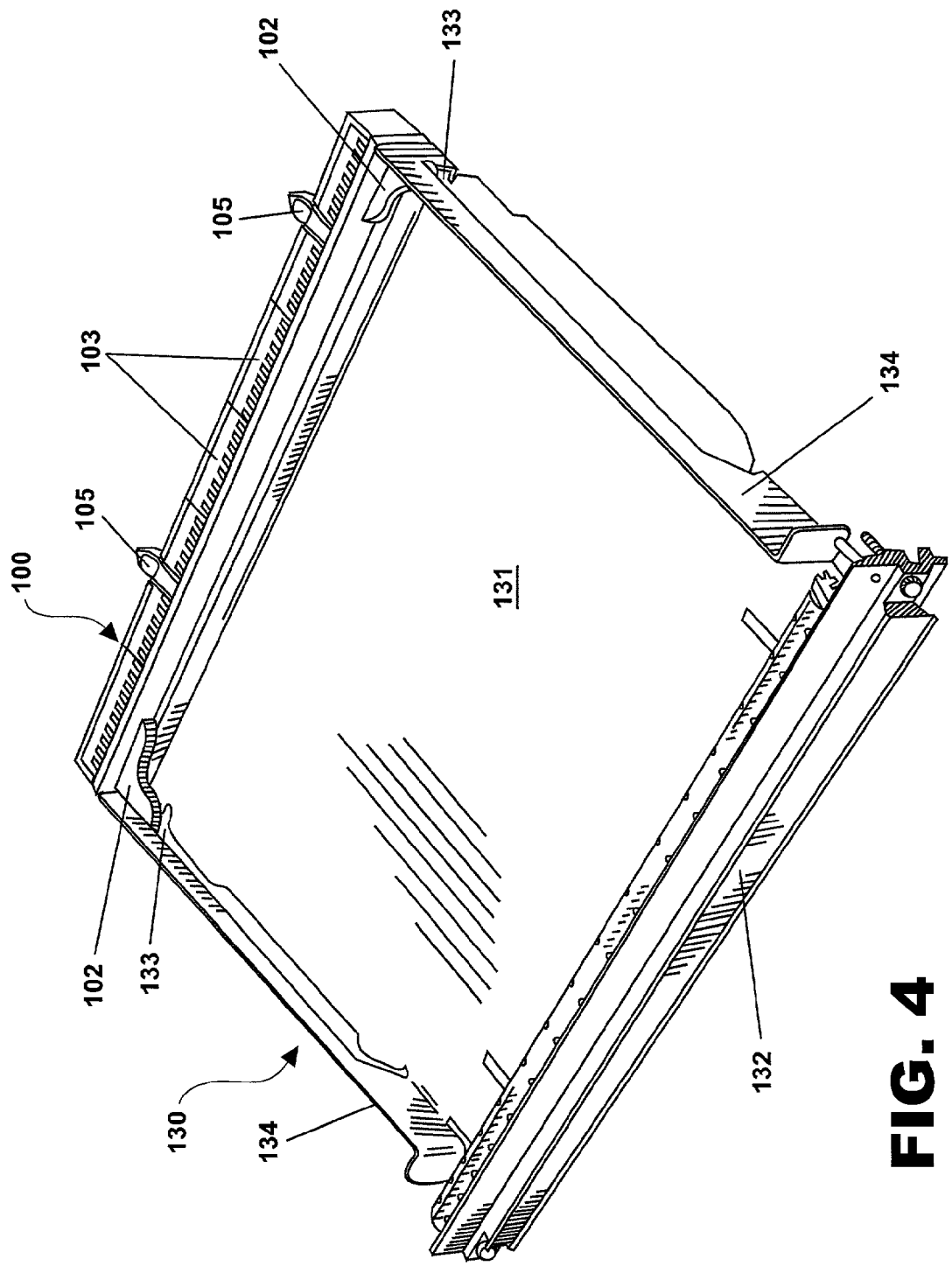
FIG. 4 is an illustration of the protective cover of FIG. 1 and the divider of FIG. 3 as assembled according to an embodiment of the present invention.

FIG. 4 is an illustration of the protective cover of FIG. 1 and the divider of FIG. 3 as assembled according to an embodiment of the present invention. As shown in FIG. 4, the protective cover (100) is attached to the divider (130) at an end of the divider (130) opposite the divider's handle (132). The hooks (102) of the protective cover (100) are engaged, respectively, in the slots (133) of the divider (130). The end of the planar sheet (131) of the divider (130) opposite the divider's handle (132) slides into the gap (107; FIG. 1) between the hooks (102) and the handle (101) of the protective cover (100).

When the protective cover (100) and the divider (130) are assembled together, as shown in FIG. 4, the assembly can be installed in any unoccupied blade slot in a blade server. The protective cover (100) then protects the pins of the blade connector in that blade slot, while the divider (130) divides the blades or blade slots on either side of the blade slot in which the assembly is installed.

Figure 5:
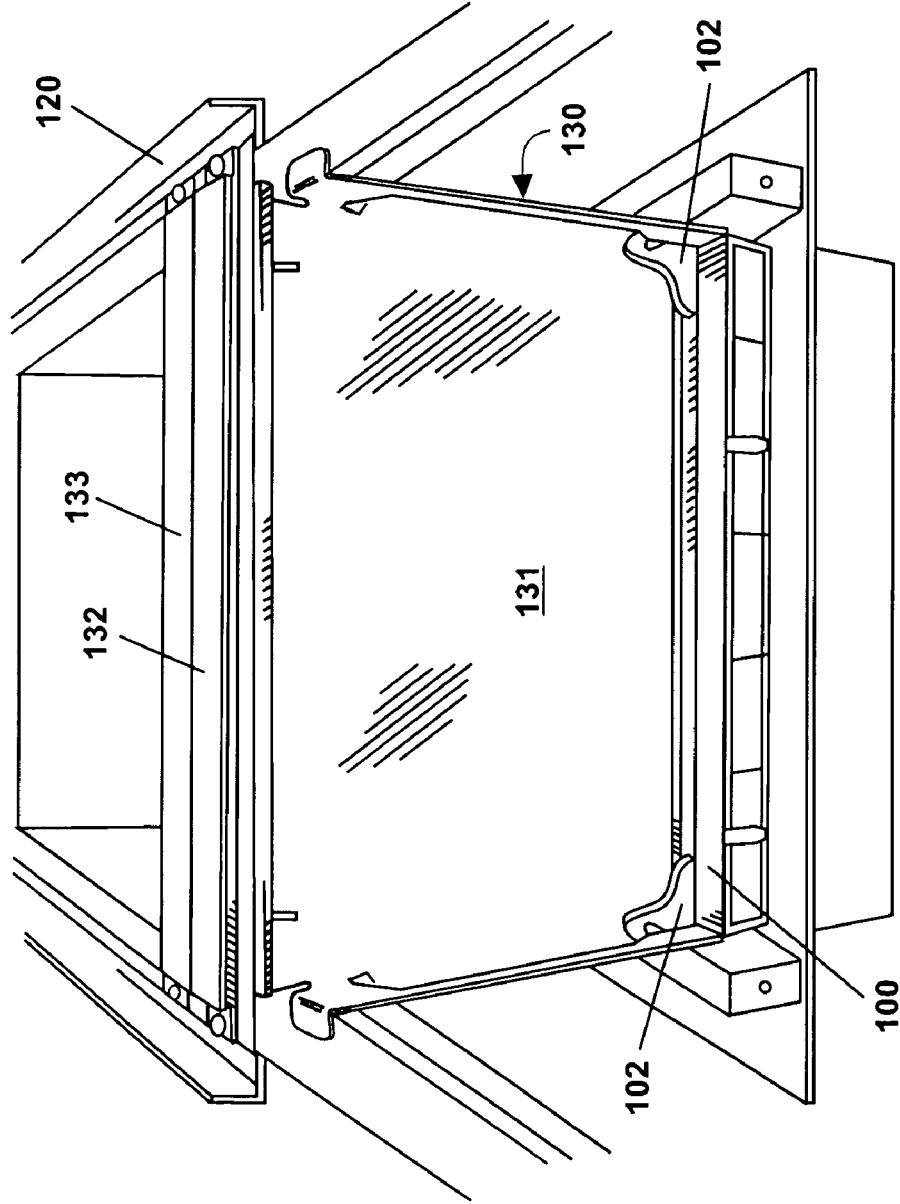
FIG. 5 is an illustration of the assembled divider and protective cover of FIG. 4 installed on a backplane and in the rack of a blade server.

FIG. 5 is an illustration of the assembled divider and protective cover of FIG. 4 installed on a backplane and in the rack of a blade server. As shown in FIG. 5, the assembled protective cover (100) and divider (130) can be installed in the rack (120) of a blade server. The protective cover (100) then protects the pins of a blade connector on the backplane of the blade server, while the divider (130) divides the blades (133) or blade slots on either side of the blade slot in which the assembly is installed.

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. A method of protecting pins of a pin connector of a backplane, said method comprising:
    installing a protective cover over said pins of said pin connector, said protective cover being electrically inactive and comprising at least one connector having receptacles for receiving said pins of said pin connector of said backplane and a handle extending from said at least one connector; and
    engaging said protective cover with a divider for dividing blades connected to said backplane.

2. A method of making a protective cover for pins of a pin connector of a backplane, said method comprising:
    obtaining a number of connectors having receptacles for receiving said pins;
    sizing said connectors to a common thickness;
    attaching said connectors to a handle; and
    providing hooks on said protective cover for engaging a divider for dividing blades connected to said backplane.

3. The method of claim 2, further comprising engaging said divider with said hooks.

4. A protective cover for a pin connector of a backplane, said cover comprising:
    at least one connector having receptacles for receiving pins of a pin connector of a backplane;
    a handle extending from said at least one connector for installing or removing said protective cover;
    hooks disposed on said cover for engaging a divider for dividing blades connected to said backplane; and
    a divider for dividing blades connected to said backplane, said divider being removably engaged with said cover by said hooks.

5. The cover of claim 4, wherein said divider comprises:
    a planar sheet extending from said engaged cover; and
    a handle at an opposite end of said planar sheet from said engaged cover.

6. The cover of claim 4, wherein said receptacles are arranged in conformance with the Compact Peripheral Component Interconnect standard.

7. The cover of claim 4, wherein said at least one connector comprises a plurality of connectors attached to a plate of said handle.

8. A method of making a protective cover for pins of a pin connector of a backplane, said method comprising:
    obtaining a number of connectors having receptacles for receiving said pins;
    attaching said connectors to a handle; and
    providing hooks on said protective cover that are configured to engage a divider for dividing blades connected to said backplane.

9. A method of claim 8, further comprising engaging said divider with said hooks.

10. The method of claim 8, wherein said obtaining a number of connectors comprises obtaining connectors that conform to the Compact Peripheral Component Interconnect standard.

11. A protective cover for a pin connector of a backplane, said cover comprising:
    at least one connector having receptacles for receiving pins of a pin connector of a backplane;
    a handle extending from said at least one connector for installing or removing said protective cover;
    hooks disposed on said cover configured to engage a divider for dividing blades connected to said backplane.

12. The cover of claim 11, further comprising a divider for dividing blades connected to said backplane, said divider being removably engaged with said cover by said hooks.

13. The cover of claim 12, wherein said divider comprises
    a planar sheet extending from said engaged cover; and
    a handle at an opposite end of said planar sheet from said engaged cover.

14. The cover of claim 11, wherein said receptacles are arranged in conformance with the Compact Peripheral Component Interconnect standard.

15. The cover of claim 11, wherein said at least one connector comprises a plurality of connectors attached to a plate of said handle.

16. A protective cover for a pin connector of a backplane, said cover comprising:
    at least one connector having receptacles for receiving pins of a pin connector of a backplane;
    a plate to which said at least one connector is attached;
    a handle extending from said plate for installing or removing said protective cover; and
    hooks disposed on said plate and configured to engage a divider for dividing blades connected to said backplane;
    wherein said handle and said hooks are disposed along opposite edges of said plate.

17. The cover of claim 16, further comprising a divider for dividing blades connected to said backplane, said divider being removably engaged with said cover by said hooks.

18. The cover of claim 17, wherein said divider comprises:
    a planar sheet extending from said engaged cover; and
    a handle at an opposite end of said planar sheet from said engaged cover.

19. The cover of claim 17, wherein said divider, when engaged with said cover, extends between said handle and said hooks on said plate.

20. The cover of claim 16, wherein said receptacles are arranged in conformance with the Compact Peripheral Component Interconnect standard.

21. The cover of claim 16, wherein said at least one connector comprises a plurality of connectors attached to a plate of said handle.

22. A protective cover for a pin connector of a backplane, said cover comprising:
    at least one connector having receptacles for receiving pins of said pin connector of said backplane; and
    a handle extending vertically from said at least one connector for installing or removing said protective cover;
    said cover further comprising hooks disposed on said cover for engaging a divider for dividing blades connected to said backplane;
    wherein said cover does not comprise a circuit board.

23. The cover of claim 22, wherein said handle extends substantially at a right angle with an upper surface of said at least one connector.

24. The cover of claim 22, wherein said handle extends along a direction parallel to said pins and along which said cover is installed on said pin connector.

25. The cover of claim 22, wherein said receptacles are arranged in conformance with the Compact Peripheral Component Interconnect standard.

26. The cover of claim 22, wherein said handle comprises a right angle with a horizontal plate portion at a bottom of said vertically extending portion of said handle, wherein said at least one connector comprises a plurality of connectors attached to said plate of said handle.

27. A protective cover for a pin connector of a backplane, said cover comprising:
 at least one connector having receptacles for receiving pins of said pin connector of said backplane;
 a handle extending from said at least one connector for installing or removing said protective cover; and
 hooks disposed on said cover for engaging a divider for dividing blades connected to said backplane;
 wherein said cover does not comprise a circuit board.

28. A device for protecting pins of a pin connector of a backplane, said device comprising:
 cover means for receiving and covering said pins of said pin connector; and
 means, attached to said cover means, for facilitating installation and removal of said cover means; and
 divider means removably engaged with said cover means for dividing blades connected to said backplane;
 wherein said cover means device does not comprise circuitry.

* * * * *